United States Patent [19]
Kim

[11] Patent Number: 5,920,377
[45] Date of Patent: Jul. 6, 1999

[54] MULTI-HOOD SYSTEM FOR CORRECTING INDIVIDUAL LENS DISTORTIONS

[75] Inventor: Kwang Chul Kim, Kyungsangbuk-do, Rep. of Korea

[73] Assignee: LG Semicon Co., Ltd.

[21] Appl. No.: 08/827,188

[22] Filed: Mar. 27, 1997

[30] Foreign Application Priority Data

May 21, 1996 [KR] Rep. of Korea ...................... 96/17243

[51] Int. Cl.[6] .............................. G03B 27/52; G02B 3/12
[52] U.S. Cl. ................................. 355/30; 355/52; 355/53; 359/509; 359/512
[58] Field of Search ................................. 355/30, 53, 55, 355/52; 359/507, 509, 512

[56] References Cited

U.S. PATENT DOCUMENTS

| | | | |
|---|---|---|---|
| 4,616,908 | 10/1986 | King | 359/509 |
| 4,690,528 | 9/1987 | Tanimoto et al. | 353/101 |
| 4,825,247 | 4/1989 | Kemi et al. | 355/30 |
| 5,425,045 | 6/1995 | Hamatani | 359/509 |
| 5,696,623 | 12/1997 | Fujie et al. | 355/30 |

FOREIGN PATENT DOCUMENTS 7-115049  5/1995  Japan .

*Primary Examiner*—Alan A. Mathews

[57] ABSTRACT

A multi-hood system for correcting individual lens distortions includes an air supply hood provided on an outer circumference of a lens; a plurality of air dividing partitions for dividing the air supply hood into a plurality of divided regions; and a plurality of air supply lines for individually supplying air of predetermined temperatures to the divided regions of the air supply hood.

13 Claims, 10 Drawing Sheets

"L"

"L"

"L"

------- map of a normal case
——— map with distortion 11. temperature sensor
12. air filter
20. air damper
19. fan motor 15. heater
18. coolers
17. temp controller current state ↓ turns hood by 45°

MULTI-HOOD SYSTEM FOR CORRECTING INDIVIDUAL LENS DISTORTIONS

BACKGROUND OF THE INVENTION

1. Field of the Invention

The present invention relates to a multi-hood system for correcting individual distortions in a reduction projection lens for use in semiconductor exposure, according to rates of the distortions in individual regions of the lens.

2. Discussion of the Related Art

As shown in FIG. 1, which illustrates a conventional exposure system used for photomasking, a fabrication process of a semiconductor device includes, in general, a reticle stage 8 for mounting a reticle 7, a field lens 9 for adjusting the magnification of a lens, a reduction projection lens 1 for determining a size of an exposed pattern, and a wafer chuck 10 for mounting a wafer 5, arranged in order from top to bottom. A temperature controller 6 is provided with an air supply hood 2a around the outer circumference of the reduction projection lens 1 of the exposure system, and controls a temperature of the air supplied to the air supply hood 2a through a supply line 4a in order to maintain the temperature in the air supply hood 2a constant.

Accordingly, in the conventional exposure system, light from a light source reduces a pattern area of the reticle 7 at a predetermined ratio and projects a pattern onto the surface of the wafer 5. In this instance, the pattern formed on the surface of the wafer 5 is distorted due to lens aberrations, such as astigmatism existing in the reduction projection lens 1. In order to cope with this inaccurate formation of the pattern on the surface of the wafer 5 by the light passed through the field lens 9 and the reduction projection lens 1 along the light path shown in FIG. 1 due to the lens aberration, the temperature of the reduction projection lens 1 is elevated or lowered by controlling a temperature of the air supplied to the air supply hood 2a provided around the reduction projection lens 1. The controlled temperatures expand or contract the reduction projection lens 1 to minimize the distortion.

However, when the distortion of the pattern formed on the surface of the wafer 5 is corrected by controlling the temperature of air supplied to the air supply hood 2a to expand or contract the reduction projection lens 1, the uniform distribution of air supplied around the reduction projection lens 1 along the circumference of the air supply hood 2a causes the reduction projection lens 1 to expand or contract evenly in its entirety. Accordingly, if the rate of distortion of the reduction projection lens 1 is different from region to region of the lens' outer circumference, then a perfect correction of the distortion of the pattern formed on the wafer is not possible. For example, as shown in FIG. 3a, if rates of distortions in all regions of the pattern formed on the wafer are identical, then air of the same temperature is supplied throughout all the circumference of the lens thus eliminating the distortions on the pattern. That is, if the actual pattern shown with a solid border was formed greater than the desired size shown by dotted borders in FIG. 3a, then air of a lower temperature is supplied into the air supply hood 2a for restoring the size of the pattern to normal as shown in FIG. 3b. However, different from the aforementioned case, if there is a region "L" on the pattern which has a distortion rate different from another region such as in FIG. 3c, then air of the same temperature supplied to all regions of the reduction projection lens 1 cools down the reduction projection lens 1 uniformly, as shown in FIG. 3d. The region which has a uniform distortion rate is corrected of its distortion, but the region which has a different distortion rate still has a distortion. Each of the dotted lines in FIGS. 3a and 3c is provided to show a normal sized pattern for comparison to a wrongly formed pattern. Although only the case in which the pattern size is expanded greater than normal has been explained herein in connection with FIGS. 3a~3d, a situation in which the pattern size is contracted smaller than normal will have incorrectable distortions when the rates of distortions are different depending on the lens regions. In conclusion, due to the limit in the deviation correcting capability of the conventional distortion correcting device, there have been many problems with inaccurate formation of the pattern by exposure during photo-masking, resulting in a low exposure process yield.

SUMMARY OF THE INVENTION

Accordingly, the present invention is directed to a multi-hood system for individual distortion correction that substantially obviates one or more of the problems arising from limitations and disadvantages of the related art.

An object of the present invention is to provide a multi-hood system for individual distortion correction, in which distortions of a pattern are corrected individually for improving the product yield.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as in the appended drawings.

To achieve these and other advantages and in accordance with the purpose of the present invention, as embodied and broadly described, the multi-hood system for individual distortion correction includes an air supply hood provided on an outer surface of a reduction projection lens, a plurality of air dividing films for dividing the air supply hood into a plurality of regions, and a plurality of air supply lines for independently suppling air of predetermined temperatures to each of the divided regions of the air supply hood.

The plurality of air dividing films are arranged in the air supply hood along the outer surface of the reduction projection lens.

Air of a temperature different from other regions may be supplied to each of the divided regions of the air supply hood.

In the alternative, air of the same temperature may be supplied to each of the divided regions of the air supply hood.

The air supply hood may have a form of a circular hollow column.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
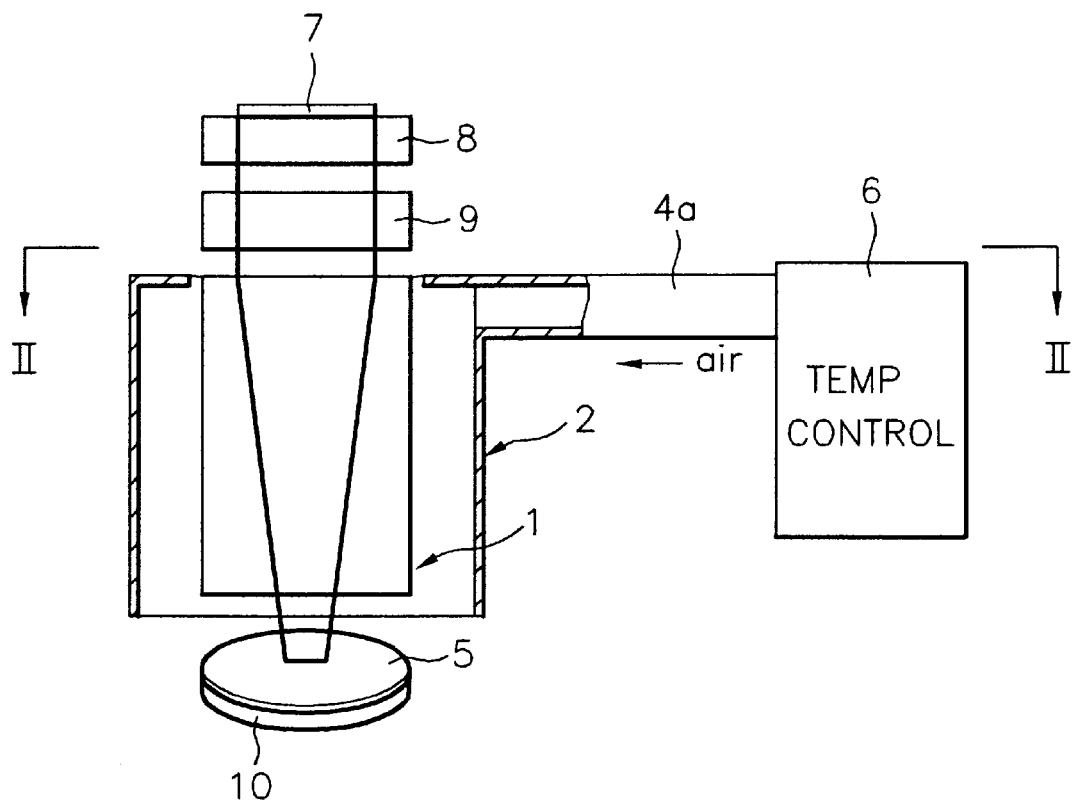
FIG. 1 illustrates a conventional exposure system.
Figure 2:
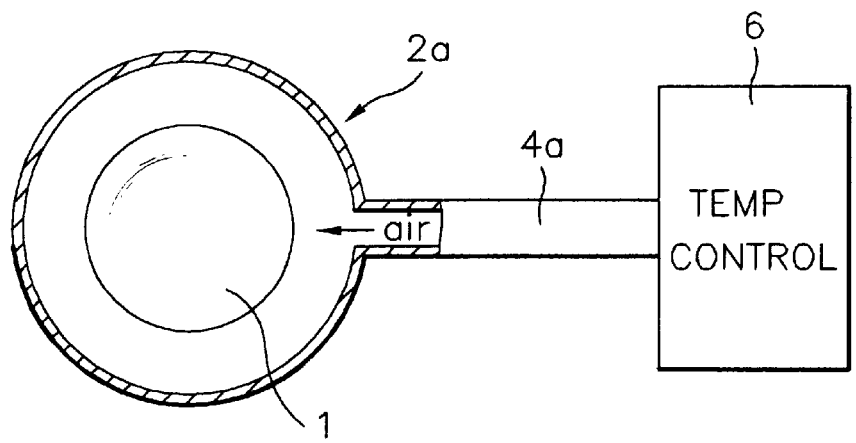
FIG. 2 illustrates a plane view across the line II—II of FIG. 1.
Figure 3A:
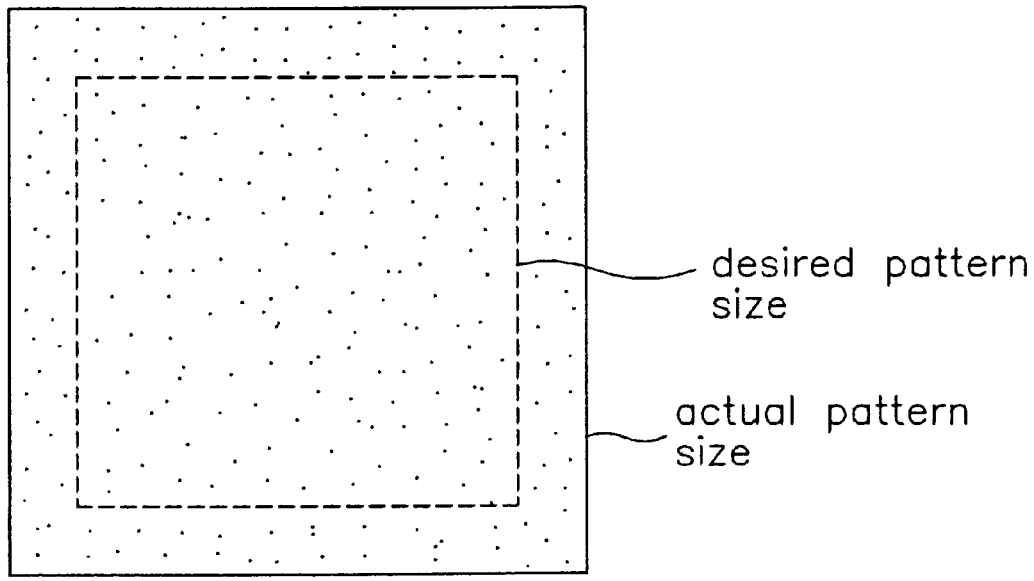
FIG. 3a illustrates a plane views showing a conventional case when a pattern has been distorted at the same rate.
Figure 3B:
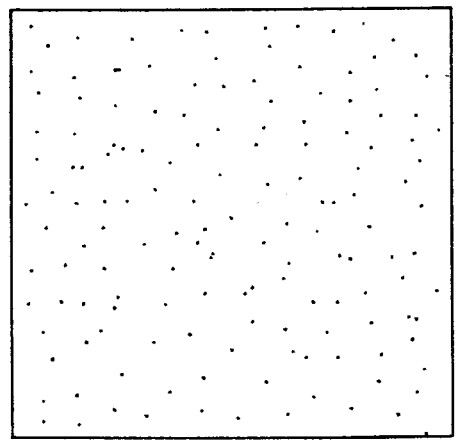
FIG. 3b illustrates a plane view showing the pattern in FIG. 3a after being corrected by the conventional system.
Figure 3C:
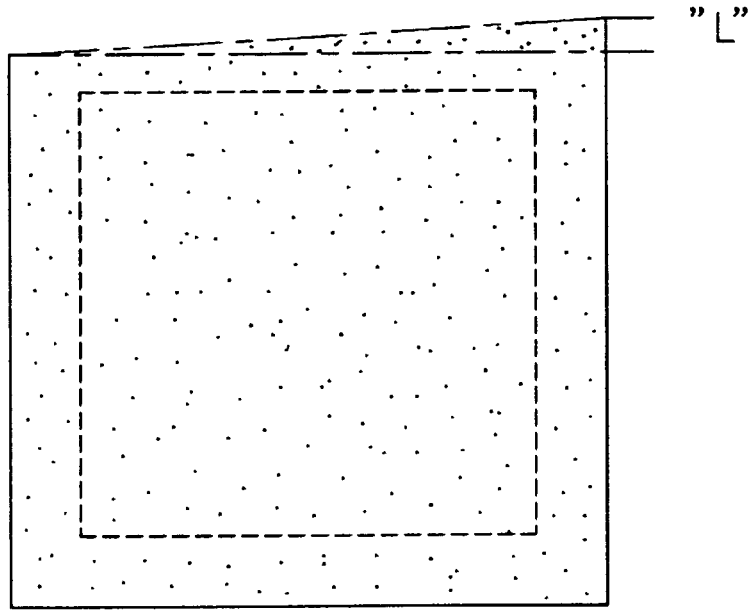
FIG. 3c illustrates a plane views showing a conventional case when a pattern has been distorted in different rates.
Figure 3D:
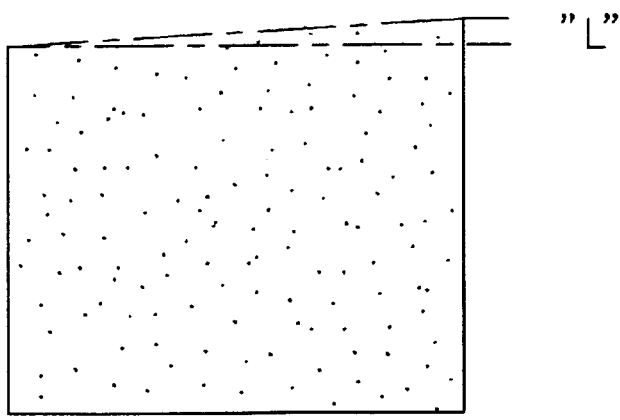
FIG. 3d illustrates a plane view showing the pattern in FIG. 3c after being corrected by the conventional system.
Figure 4:
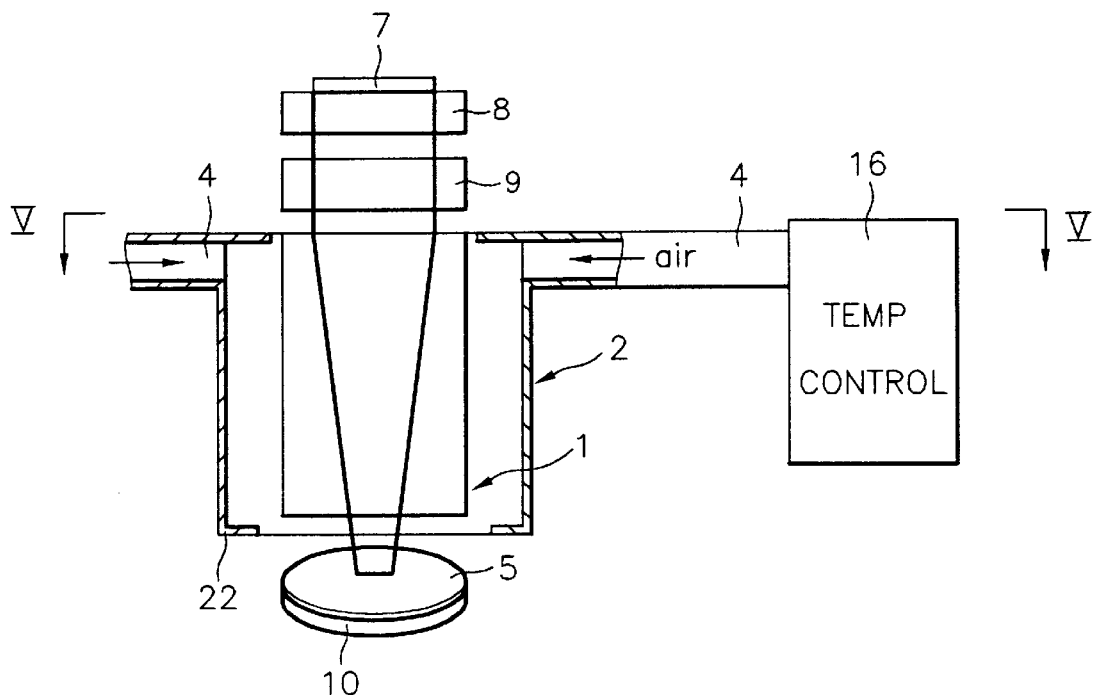
FIG. 4 illustrates an exposure system in accordance with a preferred embodiment of the present invention.
Figure 5:
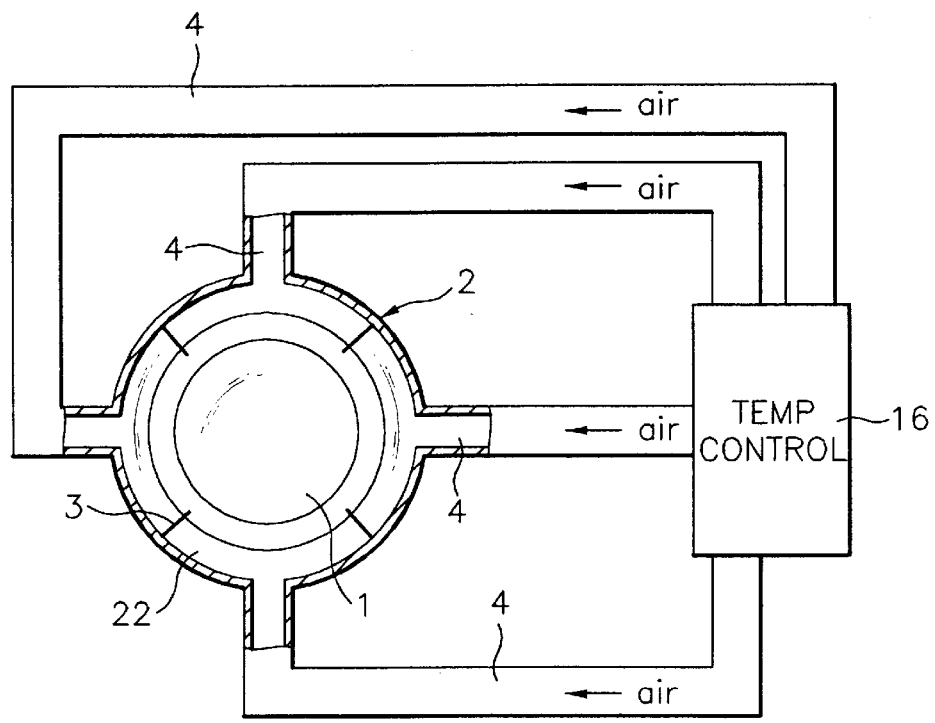
FIG. 5 is a plane view across the line V—V in FIG. 4.

FIG. 4 illustrates an exposure system in accordance with a preferred embodiment of the present invention, and FIG. 5 is a plane view across the line V—V of FIG. 4.

Referring to FIGS. 4 and 5, a multi-hood system for individual distortion correction of the present invention includes an air supply hood 2 provided on an outer circumference of a reduction projection lens 1, a plurality of air dividing partitions 3 for dividing the air supply hood 2 into a plurality of smaller hoods or divided regions, and a plurality of air supply lines 4 for the individual supply of air of predetermined temperatures to each of the divided regions of the air supply hood 2.

The operation and advantages of the multi-hood system for individual distortion correction will be explained.

If formation of an accurate pattern on a wafer 5 is not possible due to a distortion of the reduction projection lens 1 in an exposure for fabricating a semiconductor, then air of a predetermined temperature is supplied to one or more of the divided regions of the air supply hood 2 mounted on the outer circumference of the reduction projection lens 1. The region(s) supplied with air correspond to the region(s) which distort the pattern on the wafer 5, e.g. aberrations such as astigmatisms in the reduction projection lens 1. That is, when a distortion occurs only in a certain region of the pattern formed on the wafer 5, air of a predetermined temperature depending on a required amount and type of correction is supplied to the appropriate divided region(s) of the air supply hood 2. The region of the reduction projection lens 1 is indirectly heated or cooled by the air to expand or contract the lens 1 in that region, whereby the distortion formed on the wafer 5 can be corrected. In this case, the temperature of air supplied to the air supply hood 2 is of course controlled to maintain a predetermined level by a temperature controller 16.

Figure 7:
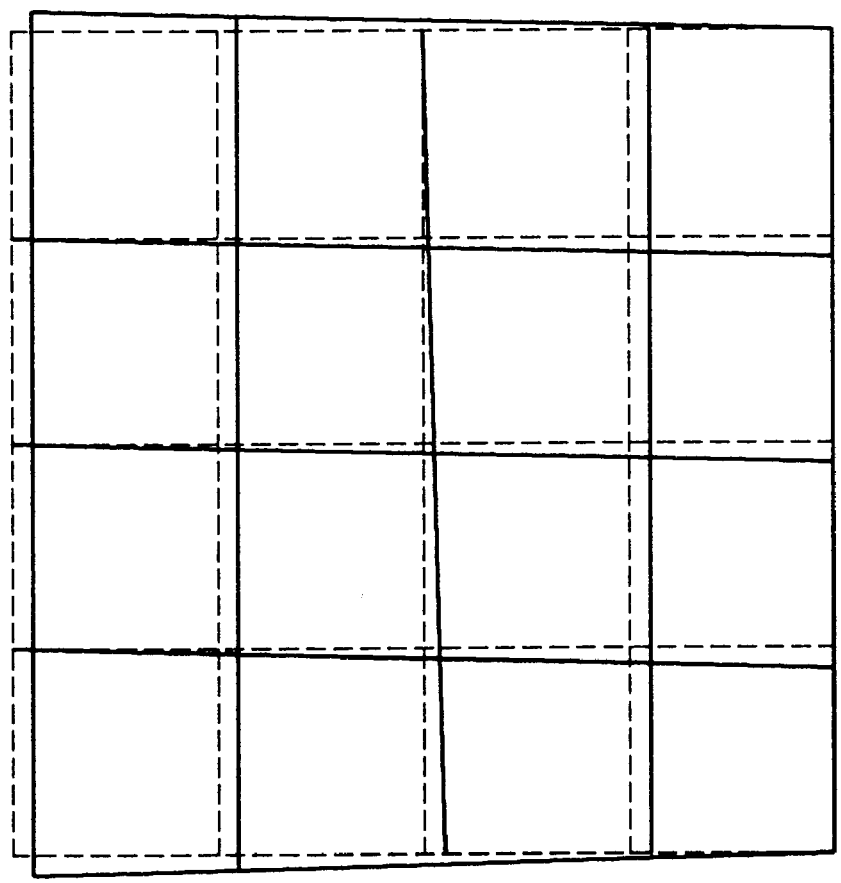
FIG. 7 illustrates one type of distortion caused by lens aberrations.

The lens aberrations are determined ahead of time by means of a test reticle (or test mask) with a special vernier after exposure of a wafer. That is, after the exposure, a reference pattern formed on the wafer is compared with the test reticle for their agreement, to draw a distortion map which indicates the extent of distortion of the pattern due to a lens aberration as shown in FIG. 7, or to calculate the lens aberration with an equation for calculating aberrations, thereby to determine the extent of the lens aberration. Though it depends on the precision of the equipment used, in general the distortion is managed to be below 1.5 PPM (a length of distortion/a length of a normal pattern) in X- and Y-axis directions.

If each of the regions of the reduction projection lens 1 exhibits not a uniform optical characteristic, but deviations in their astigmatisms, with the resulting distortions of the pattern formed on the wafer being not uniform but showing deviations from region to region, then these deviations can be corrected by supplying air of different temperatures to the divided regions of the air supply hood 2. Each of the regions of the reduction projection lens 1 would thus expand or contract in different rates. That is, when the air supply hood 2 is divided into four regions, which is the preferred embodiment of the present invention shown in FIGS. 4 and 5, air of different temperatures is supplied to each of the four divided regions of the air supply hood 2 to control temperature in each region differently and to correct the distortions differently depending on rates and directions of the distortions of the pattern. It is to be understood that the inventive hood can include as few as two divided regions, and as many as necessary to effectuate localized expansion and/or contraction. Similarly, the subdivided regions may have different sizes, may exist at different elevations over the vertical length of the hood 2, and may extend over the light-passing faces of the lens or project the temperature controlled air over specific portions of the lens and lens faces. After all, the present invention is not to be limited to the field of semiconductor device manufacturing, and is applicable for use in any environment in which an optical element is to have localized temperature control. It also need not be limited to correcting optical aberrations.

Figure 6A:
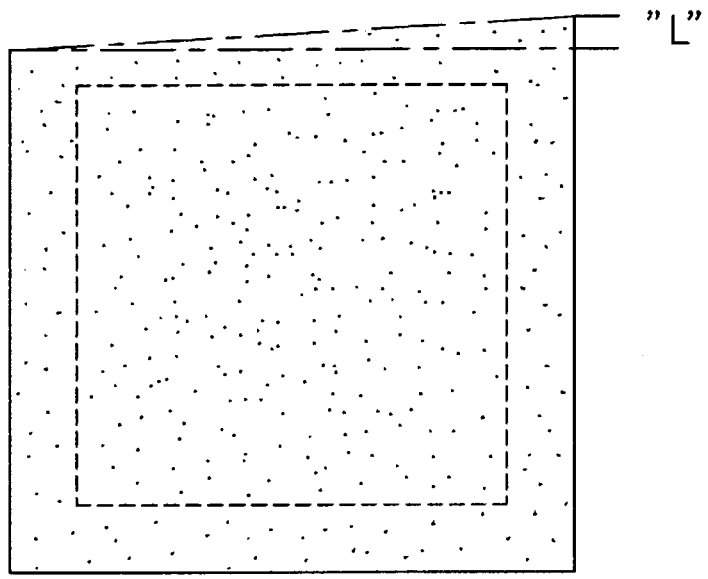
FIG. 6a illustrates a plane view showing a case when a pattern distorted in different rates.
Figure 6B:
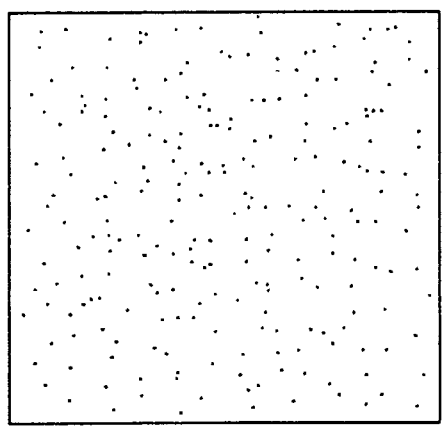
FIG. 6b illustrates a plane view showing the pattern in FIG. 6a after being corrected in the multi-hood system of the present invention.

As a specific example, if there is a region "L" in the pattern on the wafer distorted in a rate different from another region in the pattern as shown in FIG. 6a, air of different temperature is supplied to each of the divided regions of the inventive air supply hood corresponding to the region of the pattern which has a distortion rate different from the other regions. By expanding and/or contracting each of the regions of the reduction projection lens 1 in different rates, a distorted pattern on the wafer can be corrected as shown in FIG. 6b allowing a pattern of normal form to be obtained.

Accordingly, the multi-hood system for individual distortion correction of the present invention has an advantage that the formation of an accurate pattern on the wafer 5 is allowed, in which temperatures of air supplied to the divided regions of the air supply hood 2 are controlled to correct the distortions occurring in the pattern formed on the wafer in a semiconductor exposure process caused by defects in optical characteristics of the reduction projection lens coming from limits of precision in making the reduction projection lens 1.

Figure 8:
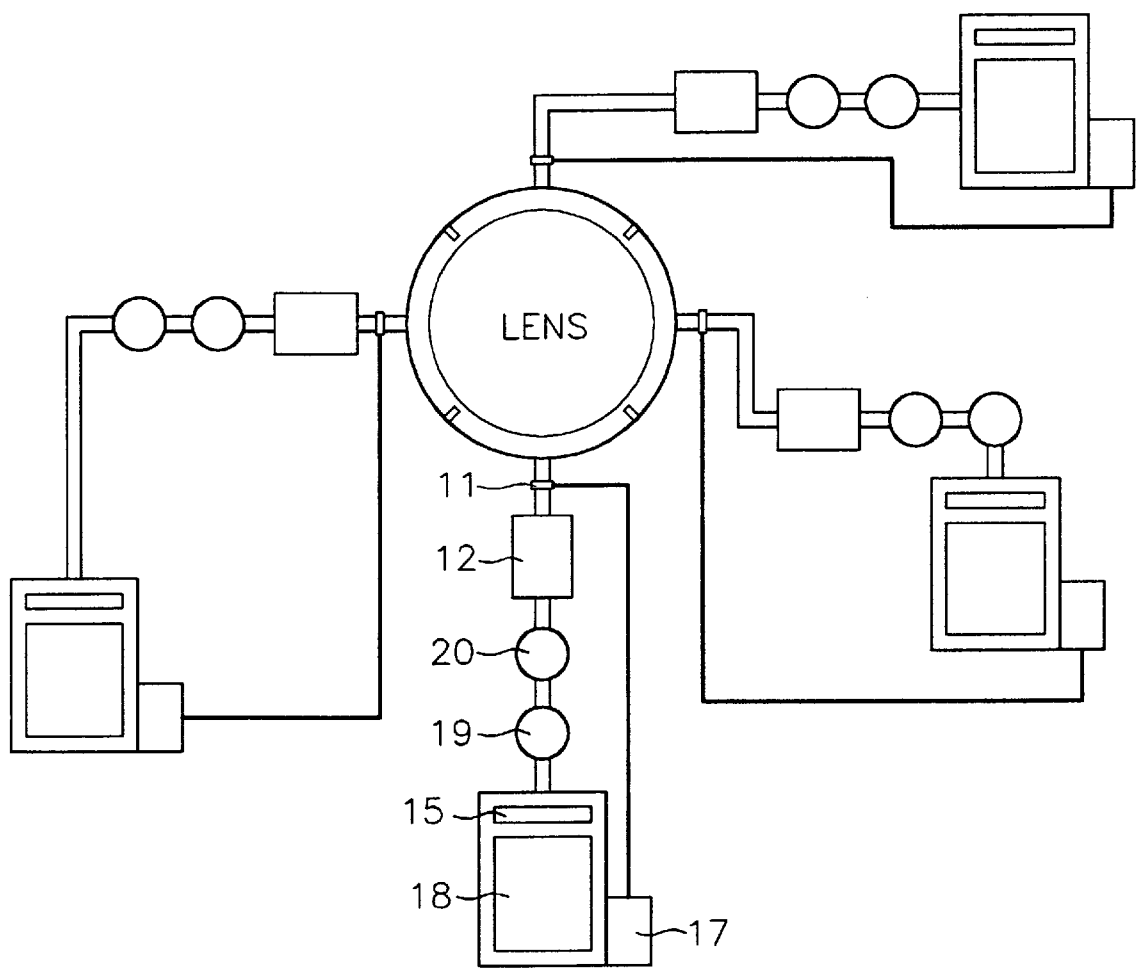
FIG. 8 illustrates an exposure system in accordance with another preferred embodiment of the present invention.

The air temperature in each of the sections is preferably controlled independently. Referring to FIG. 8, as a specific example of a hood having four sections, there is preferably provided a temperature sensor 11 at an air inlet of a respective section for sensing the temperature of the air supplied to the section. For each of the air supply lines 4, there is a full refrigerating system including a temperature controller 17, a refrigerating machine or cooler 18 and a heater 15, a fan 19 for supplying cooled or hot air to the respective hood, a motor directly coupled to the fan 19 for driving the fan, and an air damper 20 for adjusting a flow rate of the air into the hood.

The temperature controller 17 may be any type of controller, such as a PLC (Programmable Logic Controller), or one that has a built-in control element, such as CPU. The individual temperature controllers can be consolidated into one or more group controllers, such as the group temperature controller 16 shown in FIGS. 4 and 5.

The temperature control is conducted in the following way; when a user sets a desired temperature, the temperature is controlled according to P.I.D. (proportional, integral and differential) values, and, if a temperature detected by the temperature sensor 11 at the inlet is not in agreement with the user set temperature, then the temperature controller 17 or 16 controls the heater 15 or refrigerating machine 18 to turn on/off in order to heat up or cool down the air to the set temperature. In a preferred embodiment, the refrigerating machine 18 is kept on during operation of the exposure system, so the temperature of the air supplied to the section is dependent on the on/off operation of the heater 15 which is controlled independently. Other variations of the temperature control, including separate or simultaneous control of the on/off operations of the refrigerating machine 18 and/or heater 15, can be achieved by modifying the control function of the controller 17 or 16 according to the type of temperature control needed for any given application.

Preferably, the temperature controller itself does not decide the temperature of the air supplied to each of the sections. However, after the exposure for determining the lens aberrations, when a user re-sets the temperature settings of air to be supplied to each of the sections for correcting the aberrations, if the temperature from the temperature sensor 11 at the air inlet is not in agreement with the re-set temperature, the temperature controller 17 or 16 controls, in the preferred embodiment, the heater 15 to turn on/off to make the temperatures in agreement as explained above.

The aberration determination is conducted, not only before initial production, but also after the initial production when there is deterioration of the lens from prolonged use of the lens.

Figure 9:
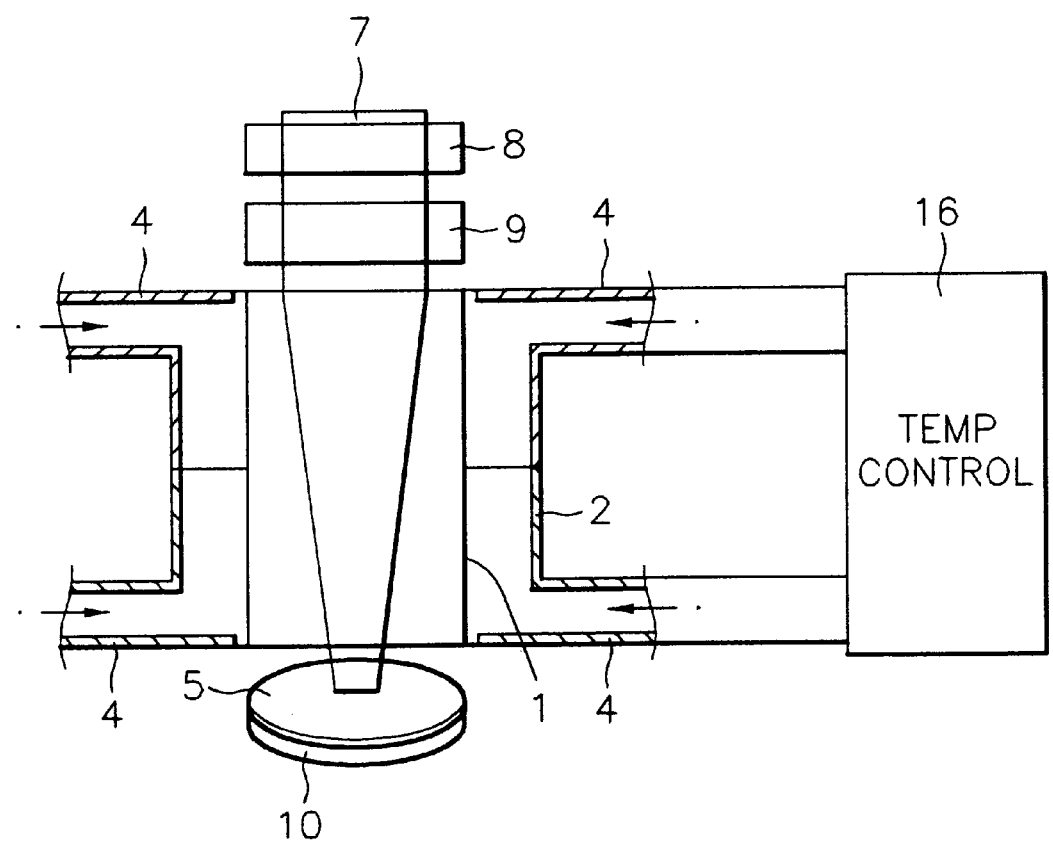
FIG. 9 illustrates another embodiment of the present invention.

According to the present invention, the hood 2 may have many configurations. A configuration shown in FIG. 9 may be possible in which air supply lines 4 are provided at two or more levels in a height direction of the lens. The lines 4 can supply independently controlled air or, by making each line 4 split into upper and lower level branches, the lines can supply the same temperature air to two or more levels of the lens. If the hood is designed to move in an up and down direction, then the controller 16 (or 17) can vary the air temperature supplied to the hood according to the up/down position of the hood.

Figure 11:
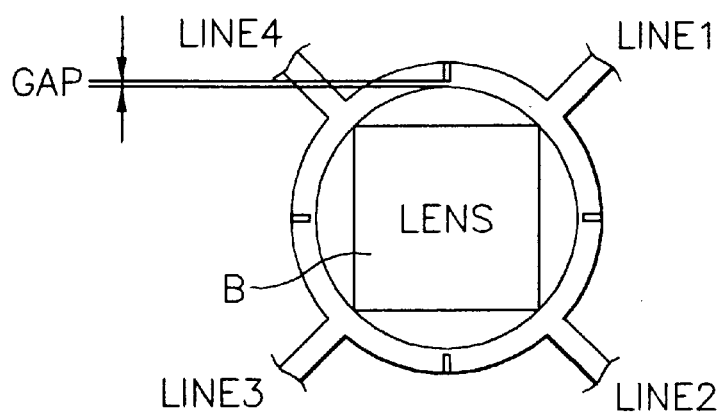
FIG. 11 illustrates a second position of a rotatable hood according to an alternative embodiment of the present invention.

Preferably, the sizes of the sections divided by the partitions remain fixed. However, air flow rates to the sections may be varied from one another using the dampers 20 in the air supply lines to obtain the same effect as if the sizes of the sections were adjustable. As seen in FIG. 8 and FIG. 11, a minute gap is preferably provided between the partitions 3 and the outer circumference of the lens.

Figure 10:
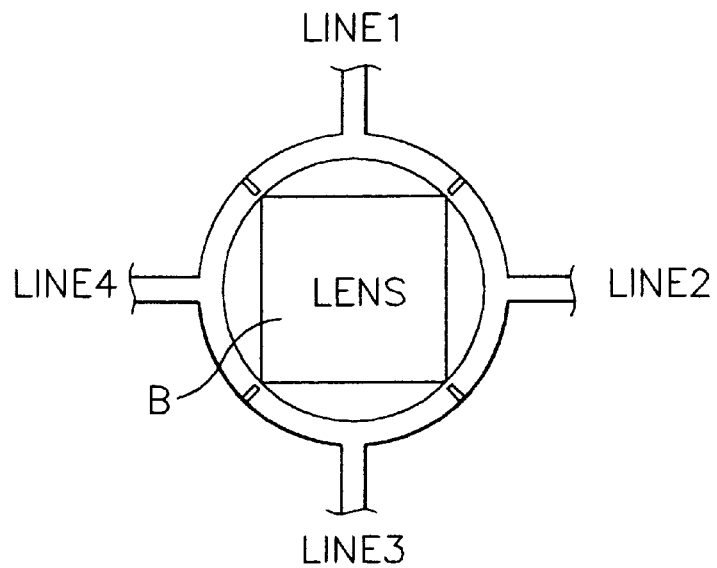
FIG. 10 illustrates a first position of a rotatable hood according to an alternative embodiment of the present invention.

The multi-section hood may be designed to be fixed in place, or to be rotated in a clockwise or counter clockwise direction. For example, as shown in FIG. 10, if a distortion is found in a region corresponding to a particular portion of the lens indicated at "B," then the entire hood may be rotated in the counter clockwise direction as shown by the arrow in FIG. 10 to supply air of a specific temperature intensely through line "3" as seen in FIG. 11, in order to eliminate the distortion at the "B" portion within the shortest amount of time. The rotation is preferably performed by an appropriate rotating mechanism (not shown) under control of the controller.

Figure 12:
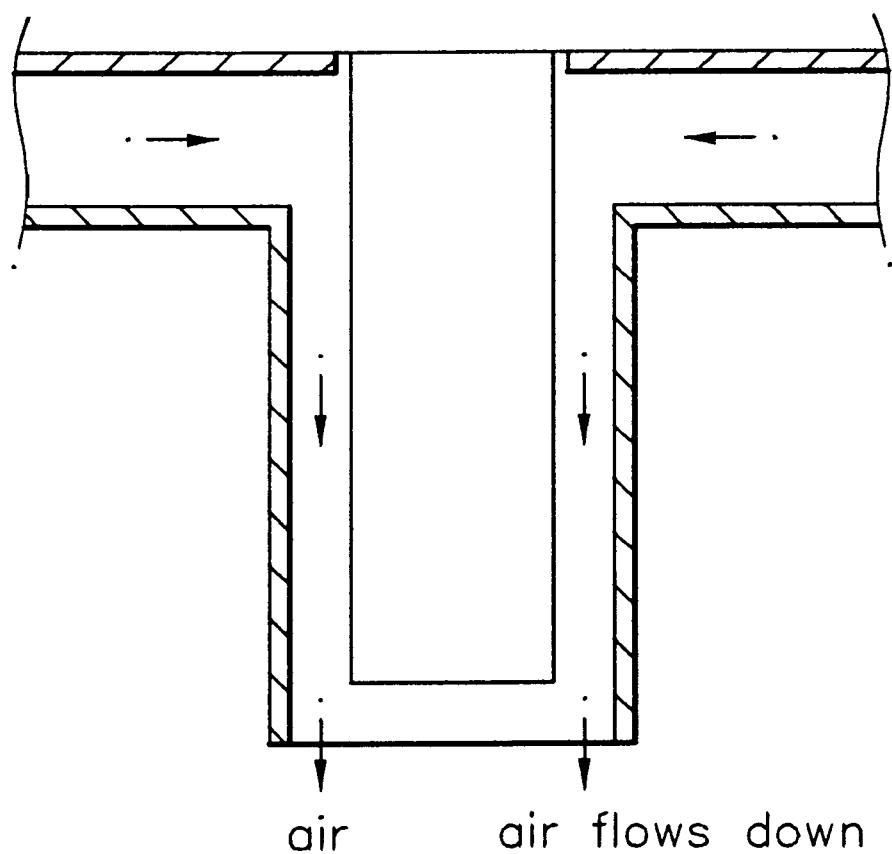
FIG. 12 illustrates a side view of a hood according to another preferred embodiment of the present invention.

Referring to FIG. 12, which illustrates a side view of the hood system, air entering into each of the sections makes direct contact with the lens. Further, although at the bottom of the hood 2, there can optionally be provided a lip 22 as shown in FIG. 4 this lip 22 may not be provided to further enhance the air flow through the hood 2. The air entered into each of the sections preferably flows downwardly and exits through openings.

As has been explained, since the multi-hood system of the present invention controls individual air temperatures in the regions of the hood divided along the outer circumference of the reduction projection lens 1 for use in the exposure of a semiconductor device to make different corrections of the distortions for respective regions in the pattern, which distortions exhibit differences from one another according to lens aberrations, such as astigmatisms of respective regions, the multi-hood system of the present invention is very useful in allowing formation of an accurate pattern on the wafer surface, and thus in improving the production yield.

It will be apparent to those skilled in the art that various modifications and variations can be made in the method and apparatus for fabricating semiconductor devices according to the present invention without departing from the spirit or scope of the invention. Thus, it is intended that the present invention cover the modifications and variations of this invention provided they come within the scope of the appended claims and their equivalents.

What is claimed is:

1. A multi-hood system for correcting individual lens distortions, comprising:

an air supply hood to be provided on an outer circumference of a lens;

a plurality of air dividing partitions for dividing said air supply hood into a plurality of divided regions; and a plurality of air supply lines each for individually supplying air to said divided regions in said air supply hood, wherein a temperature of air supplied to one of said divided regions is different than that supplied to another one of said divided regions.

2. A multi-hood system for correcting individual lens distortions as claimed in claim 1, wherein said air supply hood is substantially circular in cross section and said plurality of air dividing partitions are arranged in said air supply hood along an outer circumference of the lens.

3. A multi-hood system for correcting individual lens distortions as claimed in claim 1, wherein air of the same temperature is supplied to some of said divided regions.

4. A multi-hood system for correcting individual lens distortions as claimed in claim 1, wherein said air supply hood is formed as a circular hollow column.

5. A multi-hood system for correcting individual lens distortions as claimed in claim 1, further comprising a temperature controller for controlling the temperature of air supplied by said plurality of air supply lines.

6. A multi-hood system for correcting individual lens distortions as claimed in claim 5, wherein each air supply line supplies air to a respective one of said divided regions.

7. A multi-hood system for correcting individual lens distortions as claimed in claim 5, wherein said temperature controller controls individual air temperatures for each respective air supply line.

8. A system for supplying temperature controlled air, comprising:

an air supply hood having air dividing partitions for separating said air supply hood into a plurality of subdivided regions;

a system of air supply lines for supplying air to the plurality of subdivided regions; and an air temperature controller for supplying air of different temperatures to said system of air supply lines, wherein said air temperature controller supplies air of different temperature to at least two of the subdivided regions.

9. A system for supplying temperature controlled air as claimed in claim 8, wherein said system of air supply lines consists of one air supply line for each respective subdivided region.

10. A system for supplying temperature controlled air as claimed in claim 8, wherein said air supply hood is a substantially circular hollow column such that an element placed within the hollow column is in thermal contact with the temperature controlled air supplied to said subdivided regions.

11. A system for semiconductor device manufacturing, comprising:

an air supply hood having air dividing partitions for separating said air supply hood into a plurality of subdivided regions;

a system of air supply lines for supplying air to the plurality of subdivided regions;

a reduction projection lens positioned adjacent said plurality of subdivided regions; and an air temperature controller for supplying air of different temperatures to said system of air supply lines, wherein said air temperature controller supplies air of different temperature to at least two of the subdivided regions.

12. A system for supplying temperature controlled air as claimed in claim 11, wherein said system of air supply lines consists of one air supply line for each respective subdivided region.

13. A system for supplying temperature controlled air as claimed in claim 8, wherein said air supply hood is a substantially circular hollow column such that said lens lies within the hollow column and is in thermal contact with the temperature controlled air supplied to said subdivided regions.

\* \* \* \* \*